(12) United States Patent
Nakamura et al.

(10) Patent No.: US 11,335,535 B2
(45) Date of Patent: May 17, 2022

(54) CHARGED PARTICLE BEAM APPARATUS

(71) Applicant: Hitachi High-Tech Corporation, Tokyo (JP)

(72) Inventors: Yohei Nakamura, Tokyo (JP); Takafumi Miwa, Tokyo (JP); Heita Kimizuka, Tokyo (JP); Natsuki Tsuno, Tokyo (JP); Muneyuki Fukuda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/920,898

(22) Filed: Jul. 6, 2020

(65) Prior Publication Data

US 2021/0043415 A1 Feb. 11, 2021

(30) Foreign Application Priority Data

Aug. 8, 2019 (JP) .............................. JP2019-146172

(51) Int. Cl.
*H01J 37/244* (2006.01)
*H01J 37/28* (2006.01)
*G01N 23/2251* (2018.01)

(52) U.S. Cl.
CPC ........ *H01J 37/244* (2013.01); *G01N 23/2251* (2013.01); *H01J 37/28* (2013.01); *G01N 2223/07* (2013.01); *H01J 2237/2806* (2013.01)

(58) Field of Classification Search
CPC .. H01J 37/00; H01J 37/02; H01J 37/22; H01J 37/222; H01J 37/24; H01J 37/244; H01J 37/26; H01J 37/28; G01N 23/2251; G01N 2223/07; G01N 2223/24564; G01N 2223/418

USPC .......................................... 250/306, 307, 311
See application file for complete search history.

(56) References Cited

U.S. PATENT DOCUMENTS

| | | |
|---|---|---|
| 10,068,787 B2 | 9/2018 | Abas |
| 10,345,250 B2 | 7/2019 | Mueller et al. |
| 2003/0057971 A1 | 3/2003 | Nishiyama et al. |
| 2006/0245636 A1* | 11/2006 | Kitamura ................. G06K 9/00 382/149 |

(Continued)

FOREIGN PATENT DOCUMENTS

| | | |
|---|---|---|
| JP | 2003100823 A | 4/2003 |
| TW | 201930867 A | 8/2019 |

OTHER PUBLICATIONS

Office Action dated May 27, 2021 in Taiwanese Application No. 109122930.

*Primary Examiner* — Jason L McCormack
(74) *Attorney, Agent, or Firm* — Miles & Stockbridge, P.C.

(57) ABSTRACT

Provided is a charged particle beam apparatus capable of estimating an internal device structure of a sample. The charged particle beam apparatus includes an electron beam optical system, a detector, and a calculator. The electron beam optical system irradiates a plurality of irradiation points on a sample, which are different in position or time, with an electron beam. The detector detects electrons emitted from the sample in response to irradiation of the electron beam by the electron beam optical system. The calculator calculates a dependence relationship between the irradiation points based on the electrons detected by the detector at the plurality of irradiation points.

3 Claims, 7 Drawing Sheets

(56) References Cited

U.S. PATENT DOCUMENTS

2011/0181688 A1\* 7/2011 Miyamoto ............. G01B 15/04
348/36

\* cited by examiner

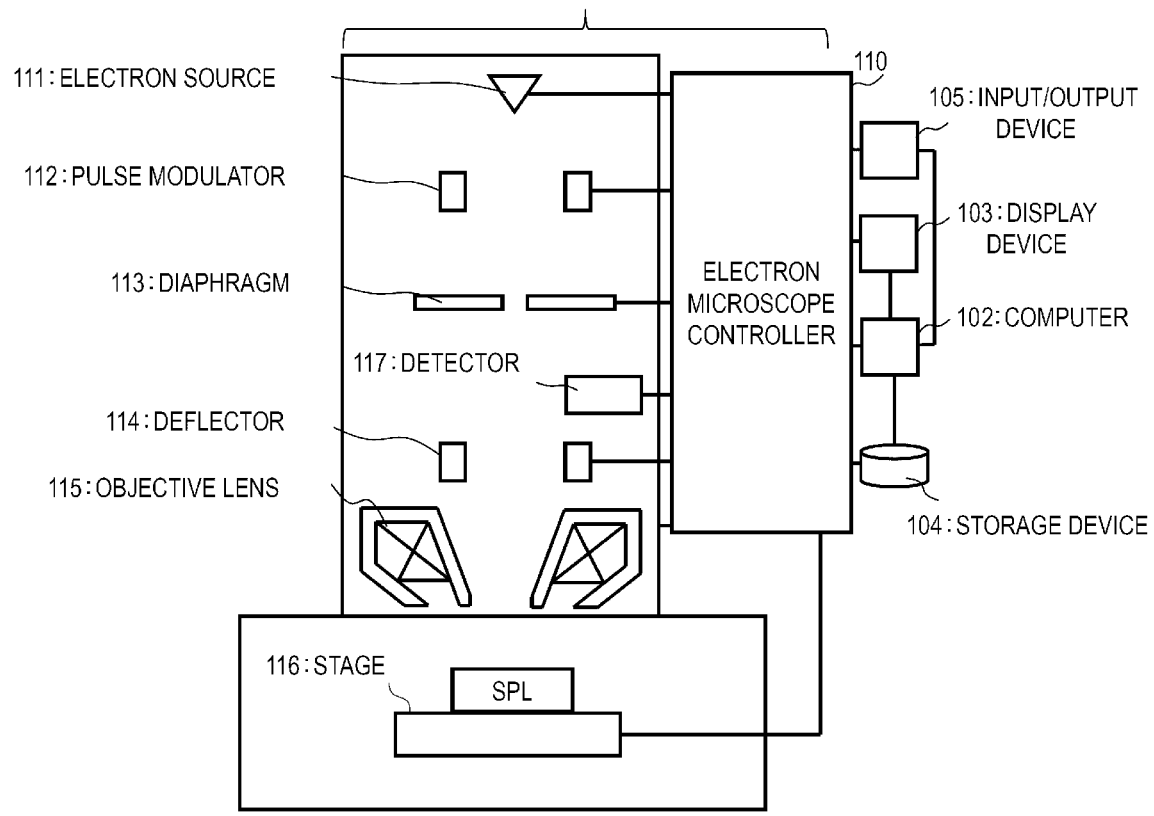

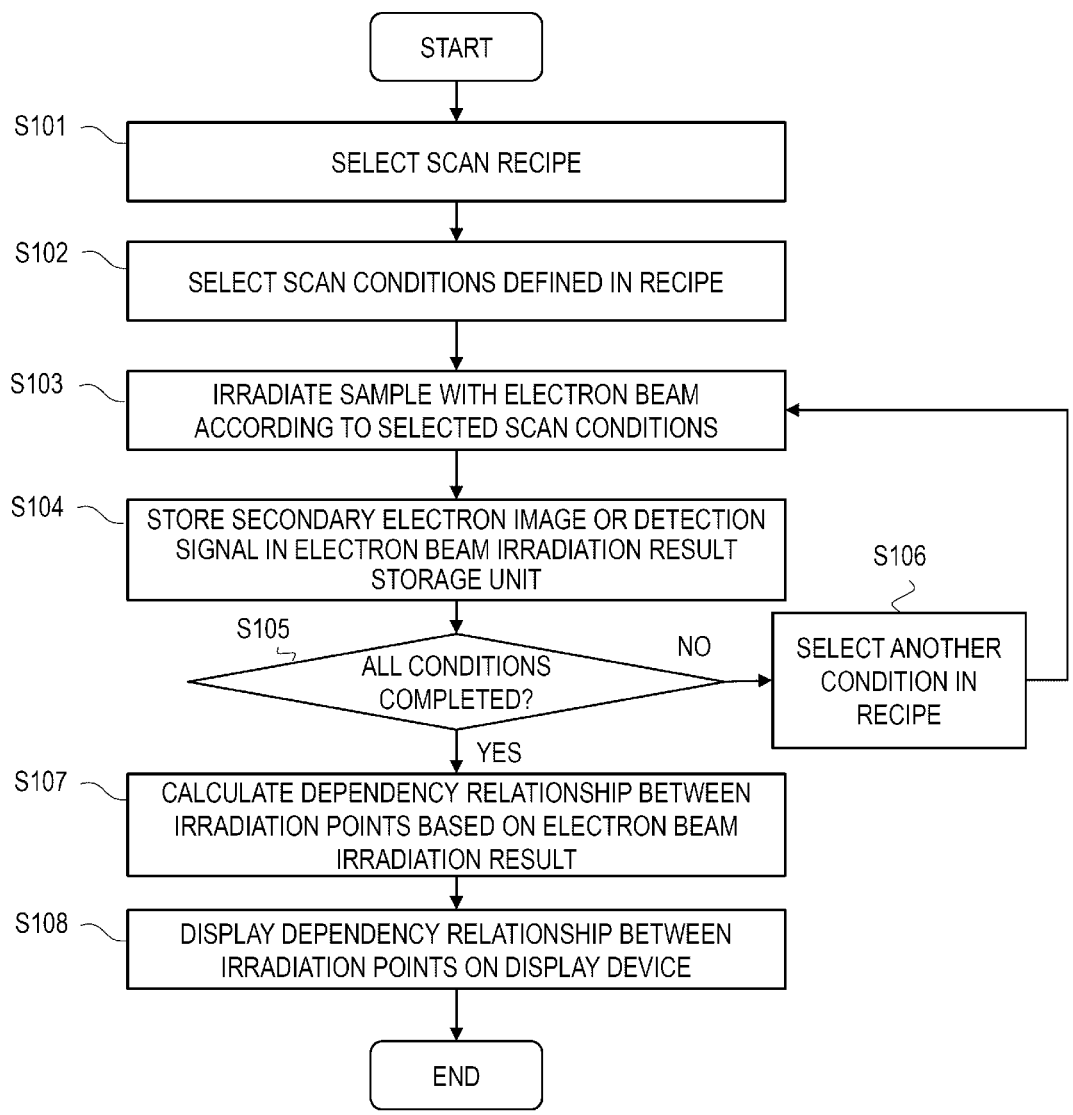

DEPENDENCY RELATIONSHIP
(DIRECTED GRAPH)

ESTIMATED DEVICE STRUCTURE
(EQUIVALENT CIRCUIT)

CHARGED PARTICLE BEAM APPARATUS

BACKGROUND OF THE INVENTION

1. Field of the Invention

The present invention relates to a charged particle beam apparatus, and relates to, for example, a technique for estimating an internal structure of a sample using a charged particle beam.

2. Description of the Related Art

As one of sample analysis methods using an electron microscope, a method is known in which a potential contrast image is formed based on detection of secondary electrons or the like obtained by irradiating a sample with an electron beam, and electrical characteristics of an element formed on the sample are evaluated based on analysis of the potential contrast image.

Patent Literature 1 (JP-A-2003-100823) discloses a method of calculating an electric resistance value based on a potential contrast to determine a defect.

Patent Literature 1 discloses a method of estimating a resistance value of a sample using a potential contrast. On the other hand, for example, in some samples, interaction may occur between components formed in the sample. In such a case, it may be difficult to sufficiently estimate an internal device structure of the sample only with a single observation condition.

SUMMARY OF THE INVENTION

The invention has been made in view of the above circumstances, and an object thereof is to provide a charged particle beam apparatus capable of estimating an internal device structure of a sample.

The above and other objects and novel features of the invention will become apparent from the description of this specification and the accompanying drawings.

An outline of a typical one of the embodiments disclosed in the present application will be briefly described as follows.

A charged particle beam apparatus according to a typical embodiment of the invention includes a charged particle beam optical system, a detector, and a calculator. The charged particle beam optical system irradiates a plurality of irradiation points on a sample, which are different in position or time, with a charged particle beam. The detector detects electrons emitted from the sample in response to irradiation of the charged particle beam by the charged particle beam optical system. The calculator calculates a dependence relationship between the irradiation points based on the electrons detected by the detector at the plurality of irradiation points.

When effect obtained by the typical embodiment of the invention disclosed in the present application is briefly described, an internal device structure of a sample can be estimated using a charged particle beam apparatus.

BRIEF DESCRIPTION OF THE DRAWINGS

FIG. 1A is a schematic view showing a configuration example of a main part of a charged particle beam apparatus according to an embodiment of the invention.

FIG. 2 is a flowchart showing an operation example of a main part of an electron microscope apparatus in FIG. 1B.

DESCRIPTION OF EMBODIMENTS

In the following embodiments, when a number and the like (including number of article, numeric value, quantity, range and the like) of an element is referred to, these parameters are not limited to the specific numbers, and the values may be greater or less than these specific numbers, unless otherwise specified or unless the specific numbers are clearly limited to specific numbers in principle. In the following embodiments, it is needless to say that constituent elements (including element steps and the like) are not necessarily essential unless otherwise particularly specified and considered as essential in principle. Similarly, in the following embodiments, shapes, position relationships, and the like of constituent elements and the like include those substantially approximate or similar to the shapes or the like unless otherwise particularly specified and not considered in principle. The same also applies to the numerical value and the range described above.

Hereinafter, an embodiment of the invention is described in detail based on drawings. The same components are generally denoted by the same reference symbols throughout all the drawings for describing the embodiments, and the repetitive description thereof will be omitted.

<<Configuration of Charged Particle Beam Apparatus>>

Figure 1B:
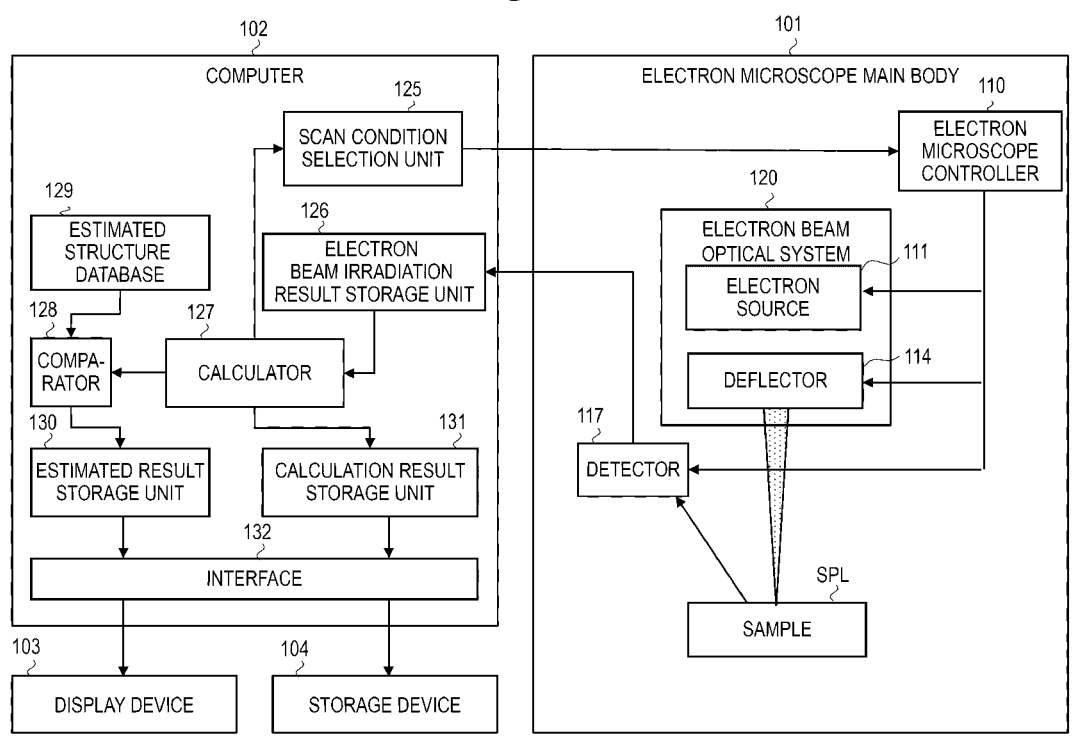
FIG. 1B is a schematic view showing a configuration example of a main part around a computer in FIG. 1A.

FIG. 1A is a schematic view showing a configuration example of a main part of a charged particle beam apparatus according to an embodiment of the invention. FIG. 1B is a schematic view showing a configuration example of a main part around a computer in FIG. 1A. In the specification, the charged particle beam apparatus is an electron microscope apparatus using an electron beam as an example, but is not limited thereto, and may be an ion microscope apparatus using an ion beam, for example. The charged particle beam apparatus shown in FIG. 1A includes an electron microscope main body 101, a computer 102, a display device 103, a storage device 104, and an input/output device 105. The input/output device 105 is, for example, a user interface such as a keyboard or a mouse.

The electron microscope main body 101 includes an electron source 111, a pulse modulator 112, a diaphragm 113, a deflector 114, an objective lens 115, a stage 116, a detector 117, and an electron microscope controller 110 that controls the above. A sample SPL is mounted on the stage 116. The pulse modulator 112 pulses (modulates) an electron beam (charged particle beam) from the electron source 111 based on a predetermined pulsing condition to irradiate the sample SPL. The deflector 114 scans the electron beam on the sample SPL.

FIG. 1B representatively shows the electron microscope controller 110, the electron source 111, the deflector 114, and the detector 117 which are shown in FIG. 1A as the electron microscope main body 101. Of these, the electron source 111, the deflector 114, and the like are referred to as an electron beam optical system (charged particle beam optical system) 120. The electron beam optical system 120 irradiates a plurality of irradiation points on the sample SPL, which are different in position or time, with the electron beam (charged particle beam). The detector 117 detects an emission amount of electrons emitted from the sample SPL (secondary electron, reflected electron) in response to irradiation of the electron beam by the electron beam optical system 120.

Here, for example, although not shown, the storage device 104 stores a plurality of scan recipes that define various conditions for irradiating the sample SPL with the electron beam. Each scan recipe determines, for example, a combination of an optical condition, a scan condition, and a pulsing condition. The optical condition determines, for example, an acceleration voltage, a retarding voltage, an irradiation current (probe current), a scan speed, a scan interval, a magnification, an opening angle, and a working distance. Although not shown, the retarding voltage is a voltage for decelerating a speed of the electron beam immediately before reaching the sample SPL by applying a voltage to the sample SPL.

The scan condition determines, for example, a scan range on a plane of the sample SPL and a direction of moving the electron beam in the scan range (for example, a rightward direction, a leftward direction, an upward direction and a downward direction). That is, the scan condition determines at which time point and at what coordinate the electron beam is focused using the deflector 114 or the like (the electron beam is focused but is not necessarily irradiated). The pulsing condition determines a pulsing condition for irradiating the sample SPL with the electron beam in a pulsed manner, and determines from which time point and during which period the irradiation of the electron beam is turned on in a predetermined control cycle. That is, the pulsing condition determines whether an actual irradiation is performed at a focused point based on the scan condition using the pulse modulator 112 or the like.

The electron microscope controller 110 in the electron microscope main body 101 controls the electron beam optical system 120 based on such a scan recipe. The electron microscope controller 110 controls the detector 117 in synchronization with a control of the electron beam optical system 120.

The computer 102 includes a computer system including, for example, a central processing unit (CPU). The computer 102 includes a scan condition selection unit 125, an electron beam irradiation result storage unit 126, a calculator 127, a comparator 128, an estimated structure database 129, an estimation result storage unit 130, a calculation result storage unit 131, and an interface 132. These units are realized by, for example, program processing by the CPU or the like, or a volatile memory or a nonvolatile memory in the computer 102 constituting a storage unit.

The scan condition selection unit 125 selects one of a plurality of scan conditions defined by the scan recipe based on a predetermined scan recipe stored in the storage device 104. The electron beam optical system 120 irradiates the sample SPL with the electron beam via control of the electron microscope controller 110 based on the scan condition selected by the scan condition selection unit 125. The detector 117 detects the electron emitted from the sample SPL in response to the irradiation of the electron beam.

The electron beam irradiation result storage unit 126 stores the electron detected by the detector 117 as the electron beam irradiation result. The electron beam irradiation result may be, for example, an actually measured value of the emission amount of secondary electrons for each irradiation point detected by the detector 117, or may be obtained by converting the actually measured value into a secondary electron image (potential contrast image).

The calculator 127 calculates a dependence relationship between the irradiation points based on the electron (that is, the irradiation result stored in the electron beam irradiation result storage unit 126) detected by the detector 117 at a plurality of irradiation points while changing the scan condition (for example, the rightward direction, the leftward direction) via the scan condition selection unit 125, details of which will be described later. Then, the calculator 127 stores the calculation result of the dependence relationship between the irradiation points in the calculation result storage unit 131. Further, the calculator 127 displays the calculation result stored in the calculation result storage unit 131 on the display device 103 via the interface 132, or stores the calculation result in the storage device 104.

The estimated structure database 129 is realized by, for example, a nonvolatile memory in the computer 102, the storage device 104, and stores a correspondence relationship between the dependence relationship between the irradiation points and device structures (or equivalent circuits). The comparator 128 outputs a corresponding device structure (or equivalent circuit) by comparing the calculation result (that is, the dependence relationship between the irradiation points) by the calculator 127 with the estimated structure database 129, and stores the corresponding device structure (or equivalent circuit) in the estimation result storage unit 130. In addition, the comparator 128 displays an estimated result stored in the estimation result storage unit 130 on the display device 103 via the interface 132, or stores the estimated result in the storage device 104.

<<Operation of Charged Particle Beam Apparatus>>

FIG. 2 is a flowchart showing an operation example of a main part of the electron microscope apparatus in FIG. 1B. In step S101, the scan condition selection unit 125 selects the scan recipe based on an instruction from the calculator 127. In the scan recipe, a plurality of scan conditions having different, for example, scan directions (the rightward direction, the leftward direction, the upward direction, the downward direction or the like) or scan speeds of the electron beam are defined. In step S102, the scan condition selection unit 125 selects one of the plurality of scan conditions (for example, a scan in the rightward direction) defined in the selected scan recipe and instructs the electron microscope controller 110 of the electron microscope main body 101.

In step S103, the electron beam optical system 120 irradiates the sample SPL with the electron beam based on the scan condition instructed from the scan condition selection unit 125 via the electron microscope controller 110. In step S104, the detector 117 detects the electron emitted from the sample SPL in response to the irradiation of the electron beam, and stores the detection result in the electron beam irradiation result storage unit 126. In step S105, the scan condition selection unit 125 determines, based on the instruction from the calculator 127, whether irradiation is completed under all scan conditions defined in the scan recipe.

When the irradiation is not completed under all the scan conditions in step S105, the scan condition selection unit 125 selects another scan condition (for example, scan in the leftward direction) in the scan recipe in step S106, and processing returns to step S103. On the other hand, when the irradiation is completed under all the scan conditions in step S105, the calculator 127 calculates the dependence relationship between the irradiation points based on the irradiation result stored in the electron beam irradiation result storage unit 126 in step S107, and stores the calculation result in the calculation result storage unit 131. Next, in step S108, the calculator 127 displays the calculation result stored in the calculation result storage unit 131 on the display device 103 via the interface 132.

<<Details of Calculator>>

Figure 3A:
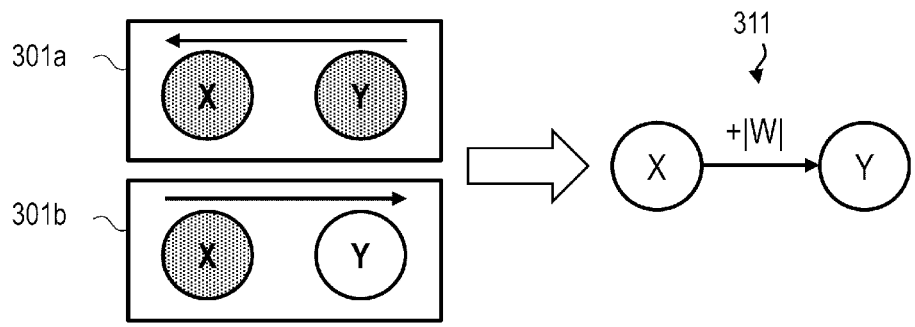
FIGS. 3A to 3D are schematic diagrams showing an example of a processing content of a calculator in FIG. 1B.

FIGS. 3A to 3D are schematic diagrams showing an example of a processing content of the calculator in FIG. 1B. FIG. 3A shows the irradiation result for irradiation points X and Y, and shows an irradiation result 301a associated with the scanning in the leftward direction and an irradiation result 301b associated with the scanning in the rightward direction. In the irradiation results 301a and 301b in FIG. 3A, the following phenomenon occurs. If the irradiation point X is pre-irradiated, there is an effect of increasing brightness of the irradiation point Y (that is, an effect of increasing the emission amount of secondary electrons from the irradiation point Y). Conversely, even if the irradiation point Y is pre-irradiated, there is no effect of increasing (or decreasing) brightness of the irradiation point X.

Therefore, the calculator 127 expresses the dependence relationship between the irradiation points X and Y in a directed graph 311 (that is, generates the directed graph 311 indicating the dependency relationship), and displays the directed graph 311 on the display device 103. Specifically, the calculator 127 expresses the dependence relationship between the irradiation points X and Y with an arrow showing the dependence relationship from the irradiation point X to the irradiation point Y and a positive weighting coefficient "+|W|" indicating strength of the dependence relationship.

Figure 3B:
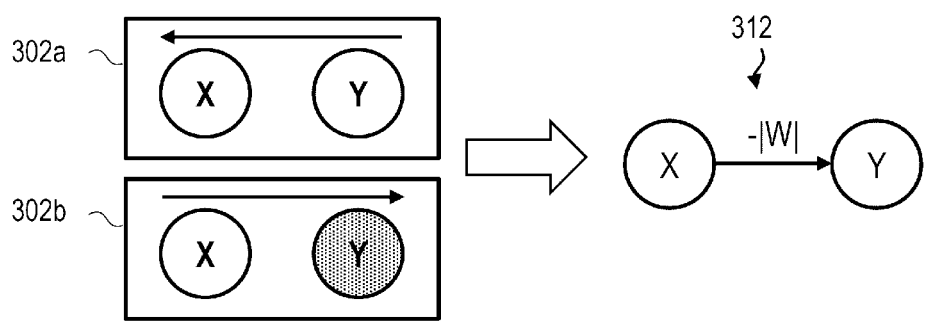

FIG. 3B also shows the irradiation result for the irradiation points X and Y, and shows an irradiation result 302a different from those in FIG. 3A associated with the scanning in the leftward direction and an irradiation result 302b different from those in FIG. 3A associated with the scanning in the rightward direction. In the irradiation results 302a and 302b in FIG. 3B, the following phenomenon occurs. If the irradiation point X is pre-irradiated, there is an effect of decreasing brightness of the irradiation point Y (that is, an effect of decreasing the emission amount of secondary electrons from the irradiation point Y). Conversely, even if the irradiation point Y is pre-irradiated, there is no effect of decreasing (or increasing) brightness of the irradiation point X. In the same manner as in a case of FIG. 3A, such a dependence relationship between the irradiation points X and Y is expressed with an arrow showing a relationship from the irradiation point X to the irradiation point Y and a negative weighting coefficient "−|W|" indicating strength of the relationship.

In this way, the calculator 127 compares the detection results by the detector 117 corresponding to the irradiation point X or the irradiation point Y when the irradiation point Y is irradiated after the irradiation point X is irradiated with the electron beam and when the irradiation point X is irradiated after the irradiation point Y is irradiated with the electron beam, so as to calculate the dependence relationship between the irradiation points X and Y which are different in position. The scanning method at this time may be, for example, a method in which the irradiation is performed continuously in the rightward direction, so that the irradiation point Y is irradiated after the irradiation point X is irradiated (that is, a method of irradiating a position between the irradiation point X and the irradiation point Y as well). Alternatively, the scanning method may be a method in which the pulse modulator 112 in FIG. 1A is used while scanning in the rightward direction, so that the irradiation point Y is explicitly irradiated after the irradiation point X is irradiated (that is, a method without irradiating the position between the irradiation point X and the irradiation point Y).

Figure 3C:
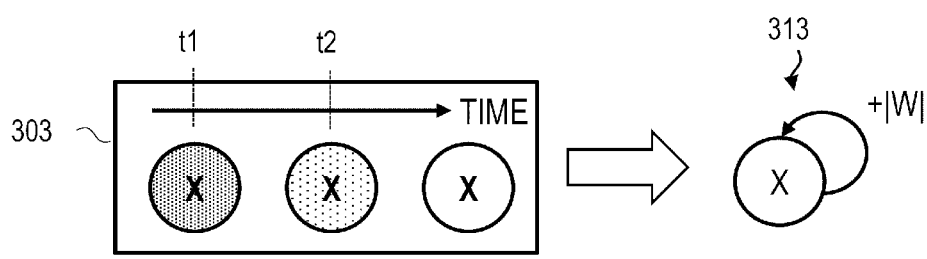

FIG. 3C shows the irradiation result when the irradiation point X is continuously irradiated. In an irradiation result 303 in FIG. 3C, the following phenomenon occurs. When the irradiation to the irradiation point X is continued, there is an effect of increasing brightness of the irradiation point X gradually (that is, an effect of increasing the emission amount of secondary electrons from the irradiation point X). The phenomenon is expressed with an arrow showing a relationship from the irradiation point X to the same irradiation point X and the positive weighting coefficient "+|W|" indicating the strength of the relationship.

Figure 3D:
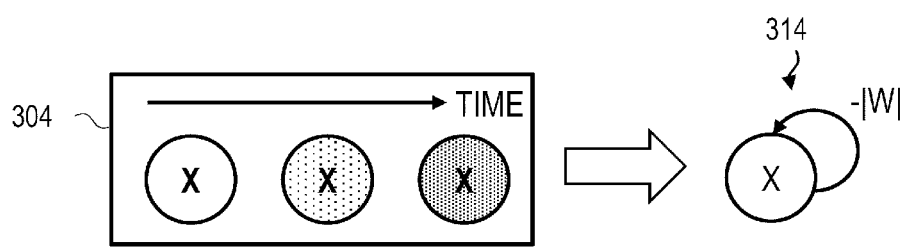

FIG. 3D also shows an irradiation result different from those in FIG. 3C when the irradiation point X is continuously irradiated. In an irradiation result 304 in FIG. 3D, the following phenomenon occurs. When the irradiation to the irradiation point X is continued, there is an effect of decreasing brightness of the irradiation point X gradually (that is, an effect of decreasing the emission amount of secondary electrons from the irradiation point X). Similar to the case in FIG. 3C, the phenomenon is expressed with an arrow showing the relationship from the irradiation point X to the same irradiation point X and the negative weighting coefficient "−|W|" indicating the strength of the relationship.

In this way, the calculator 127 compares the detection results by the detector 117 at each time point when a predetermined irradiation point is continuously irradiated with the electron beam to calculate the dependence relationship between the irradiation points X different in time. The scanning method at this time may be, for example, a method of periodically performing detection by the detector 117 while continuously irradiating the irradiation point X. Alternatively, the scanning method may be a method in which the irradiation point X is repeatedly irradiated at a predetermined time interval by using the pulse modulator 112, and the detection by the detector 117 is performed at each time.

Here, a weighting coefficient "|W|" between the irradiation points shown in FIGS. 3A to 3D can be expressed in a form of equation (1) using, for example, an irradiation time interval $\Delta T$ and a change amount $\Delta B$ of the emission amount of secondary electrons (or a change amount in brightness in the secondary electron image). For example, in a case of FIG. 3A, the irradiation time interval $\Delta T$ is a time interval between a time point when the irradiation point X is irradiated and a time point when the irradiation point Y is irradiated, and the change amount $\Delta B$ is a difference in brightness (emission amount of secondary electrons) between the irradiation result 301a and the irradiation result 301b at the irradiation point Y. Further, for example, in a case of FIG. 3C, the irradiation time interval $\Delta T$ is a time interval between a certain time point t1 and a later time point t2, and the change amount $\Delta B$ is a difference between the brightness (emission amount of secondary electrons) at time t1 and the brightness at time t2.

$$|W| = |\Delta B / \Delta T| \qquad (1)$$

Figure 4A:
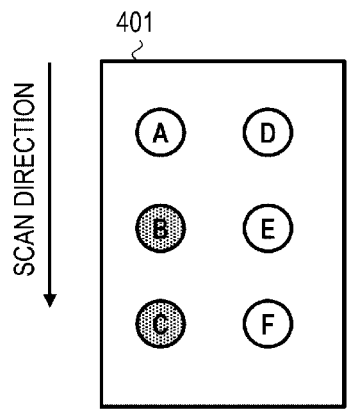
FIGS. 4A to 4D are diagrams showing an example of an irradiation result obtained from a predetermined sample while changing a scan direction in the electron microscope apparatus in FIG. 1B.
Figure 4B:
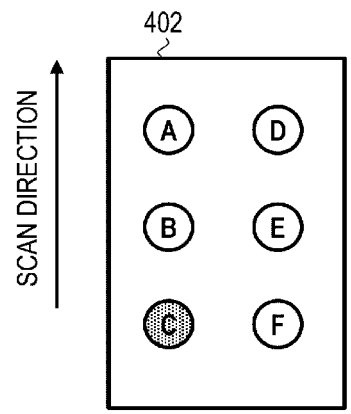
Figure 4C:
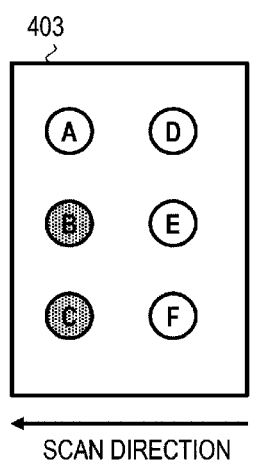
Figure 4D:
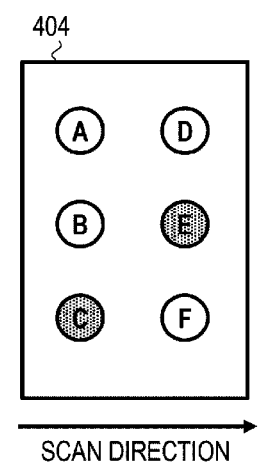
Figure 4E:
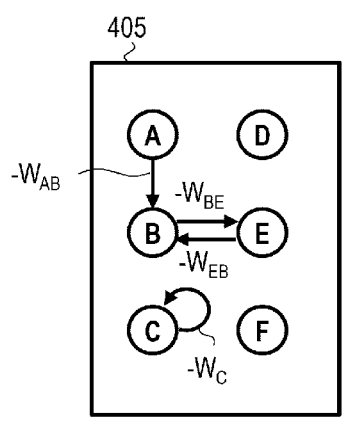
FIG. 4E is a diagram showing an example of a dependence relationship between irradiation points obtained from the irradiation results in FIGS. 4A to 4D.

FIGS. 4A to 4D are diagrams showing an example of the irradiation result obtained from a predetermined sample while changing the scan direction in the electron microscope apparatus in FIG. 1B, and FIG. 4E is a diagram showing an example of the dependence relationship between the irradiation points obtained from the irradiation results in FIGS. 4A to 4D. FIG. 4A shows an irradiation result 401 when scanning the sample in the downward direction, and FIG. 4B shows an irradiation result 402 when scanning the sample in the upward direction.

FIG. 4C shows an irradiation result 403 when scanning the sample in the leftward direction, and FIG. 4D shows an irradiation result 404 when scanning the sample in the rightward direction. For example, the scan recipe selected in step S101 in FIG. 2 defines that the scan conditions are to scan in upward, downward, leftward, and rightward directions in this manner, respectively.

Here, the calculator 127 detects, based on the irradiation results 401 and 402 in FIGS. 4A and 4B, that there is a dependency relationship having a negative weighting coefficient "$-W_{AB}$" as shown in FIG. 3B from an irradiation point A to an irradiation point B, as shown in a directed graph 405 in FIG. 4E. Further, the calculator 127 detects, based on the irradiation results 403 and 404 in FIGS. 4C and 4D, that there is a dependency relationship having a negative weighting coefficient "$-W_{BE}$" from the irradiation point B to an irradiation point E, and further there is a dependency relationship having a negative weighting coefficient "$-W_{EB}$" from the irradiation point E to the irradiation point B, as shown in the directed graph 405 in FIG. 4E.

In this example, although not shown, it is assumed that an irradiation point C is continuously irradiated with the electron beam. Further, the irradiation result for the irradiation point C is assumed to become darker as time passes, as shown in FIG. 3D. In this case, the calculator 127 detects that there is a dependency relationship having a negative weighting coefficient "$-W_C$" in time at the irradiation point C, as shown in the directed graph 405 in FIG. 4E.

<<Details of Estimated Structure Database>>

Figure 5:
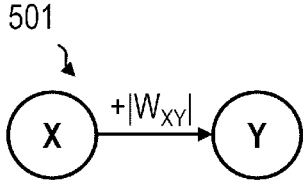
FIG. 5 is a schematic view showing a configuration example of an estimated structure database in FIG. 1B.

FIG. 5 is a schematic view showing a configuration example of the estimated structure database in FIG. 1B. As shown in FIG. 5, the estimated structure database 129 stores in advance a correspondence relationship between the directed graphs (that is, the dependence relationship between the irradiation points) and the device structures (or the equivalent circuits). For example, a directed graph 501 of item [1] indicates that the emission amount of secondary electrons from the irradiation point Y is increased by pre-irradiating the irradiation point X. In this case, it is estimated that a corresponding device structure 505 (or equivalent circuit) is, for example, a MOS transistor MT.

That is, by pre-irradiating the irradiation point X, the MOS transistor whose gate is the irradiation point X is turned on, and the irradiation point Y, which was an open node (a source or a drain), becomes a conduction node via a channel of the MOS transistor. As a result, when the irradiation point Y is irradiated with the electron beam immediately thereafter, the irradiation point Y is less likely to be charged than the case where the irradiation point X is not pre-irradiated (that is, when the irradiation point Y is an open node), and as a result, the emission amount of secondary electrons from the irradiation point Y is increased.

A directed graph 502 of item [2] indicates that the emission amount of secondary electrons from the irradiation point Y is decreased by pre-irradiating the irradiation point X. In this case, it is estimated that a corresponding device structure 506 is, for example, a diode DD whose anode is an irradiation point X side and whose cathode is an irradiation point Y side. That is, when pre-irradiating the irradiation point X, charging associated therewith also occurs at the irradiation point Y via the diode DD. As a result, when the irradiation point Y is irradiated with the electron beam immediately thereafter, a charge amount of the irradiation point Y is increased as compared with the case where the irradiation point X is not pre-irradiated, and as a result, the emission amount of secondary electrons from the irradiation point Y is decreased.

A directed graph 503 of item [3] indicates that the emission amount of secondary electrons from the irradiation point Y is decreased by pre-irradiating the irradiation point X, and conversely, the emission amount of secondary electrons from the irradiation point X is also decreased by pre-irradiating the irradiation point Y. In this case, it is estimated that a corresponding device structure 507 is, for example, a resistive element RE. That is, if the irradiation point X is pre-irradiated, the charging associated therewith also occurs at the irradiation point Y via the resistive element RE. As a result, when the irradiation point Y is irradiated with the electron beam immediately thereafter, a charge amount of the irradiation point Y is increased as compared with the case where the irradiation point X is not pre-irradiated, and as a result, the emission amount of secondary electrons from the irradiation point Y is decreased. The same applies to a case where the irradiation point X and the irradiation point Y are exchanged.

<<Estimation Processing of Device Structure>>

Figure 6A:
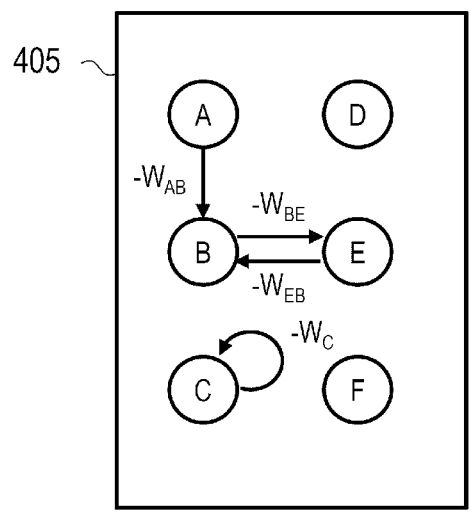
FIG. 6A is a diagram showing an example of a calculation result by the calculator in FIG. 1B.
Figure 6B:
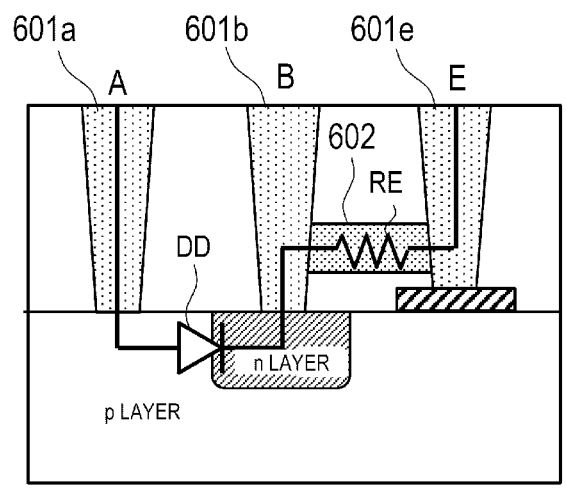
FIG. 6B is a diagram showing an example of an output content from a comparator according to the calculation result in FIG. 6A.

FIG. 6A is a diagram showing an example of a calculation result by the calculator in FIG. 1B, and FIG. 6B is a diagram showing an example of an output content from the comparator according to the calculation result in FIG. 6A. FIG. 6A shows the directed graph 405 similar to that in FIG. 4E. The comparator 128 regards a structure corresponding to the dependence relationship between the irradiation point A and the irradiation point B in the directed graph 405 as the diode DD based on item [2] of the estimated structure database 129 in FIG. 5. The comparator 128 regards a structure corresponding to the dependence relationship between the irradiation point B and the irradiation point E in the directed graph 405 as the resistive element RE based on item [3] of the estimated structure database 129 in FIG. 5.

In this way, the comparator 128 compares the calculation result (directed flag) by the calculator 127 with the estimated structure database 129 to output the corresponding device structure, the equivalent circuit, or a combination thereof, as shown in FIG. 6B. In the device structure in FIG. 6B, a contact plug 601a corresponding to the irradiation point A and a contact plug 601b corresponding to the irradiation point B are connected to each other via the diode DD whose anode is a contact plug 601a side. The contact plug 601b corresponding to the irradiation point B and a contact plug 601e corresponding to the irradiation point E are connected to each other via a conductor 602 functioning as the resistive element RE. Accordingly, the contact plug 601a and the contact plug 601e are connected to each other via the diode DD and the resistive element RE.

The irradiation point C in the directed graph 405 indicates that the emission amount of secondary electrons is decreased every time the irradiation is performed. In this case, since the charge amount is increased for each irradiation, it is estimated that the device structure has, for example, a very high insulating property. Conversely, in a case of the irradiation point having the positive weighting coefficient as shown in FIG. 3C, it is estimated that the device structure has, for example, a negative resistance characteristic. Although not shown, the estimated structure database 129 in FIG. 5 may include the device structure (or equivalent circuit) in such a case.

Further, a magnitude of the weighting coefficient "W" in the directed graph can be used, for example, as a determination criterion for distinguishing between a normal structure and a defective structure. Alternatively, the magnitude of the weighting coefficient "W" can be used as a determination criterion for distinguishing a plurality of device structures on an assumption that the plurality of device structures are estimated for the same directed graph.

Here, in an example in FIG. 1B, the effective graph 405 as shown in FIG. 6A stored in the calculation result storage unit 131 and the device structure (or equivalent circuit) as shown in FIG. 6B stored in the estimation result storage unit 130 are displayed on the display device 103. For example, when any abnormality is detected in the sample SPL, a user usually performs a failure analysis such as observing a cross-sectional structure of the sample SPL. At this time, by displaying the directed graph or the device structure (or equivalent circuit) on the display device 103, the user can determine which cross-sectional structure is appropriate to specifically observe based on the display content. As a result, it is possible to streamline the failure analysis and the like.

<<Main Effect of Embodiment>>

As described above, by using the charged particle beam apparatus according to the embodiment, the internal device structure of the sample can be representatively estimated. As a result, for example, it is possible to quickly determine a cause of a defect in a manufacturing process or a cause of a defect in a product design, and it is possible to shorten a product development period, improve reliability of the product, and reduce various costs. Here, although the dependence relationship between the irradiation points is expressed by the directed graph, other expression methods may be used as long as the direction of the dependency relationship and the strength of the dependency relationship are known.

While the invention made by the present inventors has been specifically described based on the embodiments, the invention is not limited to the embodiments described above, and various changes and modifications may be made without departing from the scope of the invention. For example, the embodiments described above have been described in detail for easy understanding of the invention, the invention is not necessarily limited to those including all the configurations described above. A part of the configuration of one embodiment can be replaced with the configuration of another embodiment, and the configuration of another embodiment can be added to the configuration of one embodiment. In addition, it is possible to add, delete, and replace other configurations for a part of the configuration of each embodiment.

What is claimed is:

1. A charged particle beam apparatus, comprising:
    a charged particle beam optical system configured to irradiate a plurality of irradiation points on a sample, which are different in position or time, with a charged particle beam;
    a detector configured to detect electrons emitted from the sample in response to irradiation of the charged particle beam by the charged particle beam optical system;
    a calculator configured to calculate a dependence relationship between the irradiation points based on the electrons detected by the detector at the plurality of irradiation points, by calculating the dependence relationship between the irradiation points while changing a scan direction of each said irradiation point from a first scan direction from a first of said plurality of irradiation points to a second of said plurality of irradiation points, to a second scan direction from the second irradiation point to the first irradiation point, said second scan direction being an opposite direction from said first scan direction;
    an estimated structure database configured to store a correspondence relationship between the dependence relationship between the irradiation points and one of a plurality of corresponding equivalent circuits of an internal device structure; and
    a comparator configured to output the corresponding equivalent circuit by comparing a calculation result by the calculator with the corresponding dependence relationship contained in the estimated structure database,
    wherein the calculator is configured to compare detection results by the detector at each time point when a predetermined irradiation point is continuously irradiated with the charged particle beam, so as to calculate the dependence relationship between the irradiation points.

2. The charged particle beam apparatus according to claim 1, further comprising:
    a display device, wherein
    the calculator is configured to generate a directed graph indicating the dependency relationship between the irradiation points, and display the directed graph on the display device.

3. The charged particle beam apparatus according to claim 2, wherein
    the directed graph includes a weighting coefficient indicating strength of the dependence relationship between the irradiation points.

* * * * *